United States Patent
Huang et al.

(10) Patent No.: US 8,816,665 B2
(45) Date of Patent: Aug. 26, 2014

(54) REFERENCE VOLTAGE STABILIZATION APPARATUS AND METHOD

(75) Inventors: Shin-Syong Huang, Changhua County (TW); Jian-Ru Lin, Nantou County (TW)

(73) Assignee: Realtek Semiconductor Corp., Hsinchu (TW)

( * ) Notice: Subject to any disclaimer, the term of this patent is extended or adjusted under 35 U.S.C. 154(b) by 260 days.

(21) Appl. No.: 13/403,504

(22) Filed: Feb. 23, 2012

(65) Prior Publication Data

US 2012/0217939 A1 Aug. 30, 2012

Related U.S. Application Data

(60) Provisional application No. 61/446,523, filed on Feb. 25, 2011.

(30) Foreign Application Priority Data

Jan. 17, 2012 (TW) .............................. 101101699 A

(51) Int. Cl.
*H02M 3/07* (2006.01)
*H03K 19/00* (2006.01)
*H02J 9/00* (2006.01)
*H02J 7/00* (2006.01)
*G05B 13/02* (2006.01)
*H02M 3/155* (2006.01)

(52) U.S. Cl.
CPC .................. *H02M 3/07* (2013.01); *H03K 19/00* (2013.01); *H02J 9/002* (2013.01); *H02J 7/0031* (2013.01); *G05B 13/02* (2013.01)
USPC ............................ 323/288; 323/281; 323/313

(58) Field of Classification Search
CPC ......... H02M 3/07; H02M 3/18; H02M 3/145; H02M 3/155; H02M 2003/07; H02M 2003/145; H02M 2003/155
USPC ................. 323/279, 280, 281, 313, 314, 288; 307/109
See application file for complete search history.

(56) References Cited

U.S. PATENT DOCUMENTS 5,243,271 A * 9/1993 Lommers ....................... 323/279

FOREIGN PATENT DOCUMENTS

JP 2007-206997 A 8/2007

* cited by examiner

*Primary Examiner* — Gary L Laxton
(74) *Attorney, Agent, or Firm* — Birch, Stewart, Kolasch & Birch, LLP

(57) ABSTRACT

A reference voltage stabilization apparatus is disclosed, having an input node for receiving a reference voltage, an output node for coupling with a load, a voltage buffer coupled between the input node and the output node, a charge storage device coupled with the output node, and a charging/discharging circuit coupled with the charge storage device for charging or discharging the charge storage device. The voltage buffer and the charged/discharged charge storage device are coupled with the load so that the voltage at the load equals the reference voltage after a period of time.

18 Claims, 3 Drawing Sheets

REFERENCE VOLTAGE STABILIZATION APPARATUS AND METHOD

CROSS-REFERENCE TO RELATED APPLICATIONS

This application claims the benefit of priority to U.S. Provisional Patent Application No. 61/446,523, filed on Feb. 25, 2011 and to Taiwanese Patent Application No. 101101699, filed on Jan. 17, 2012, the entirety of which are incorporated herein by reference for all purposes.

BACKGROUND

The present disclosure generally relates to electronic devices and, more particularly, to reference voltage stabilization apparatuses In electronic circuits, a stable reference voltage signal is essential to keep the circuit blocks functioning normally. The circuit blocks may comprise active elements, passive elements, and other suitable circuit elements. When the reference voltage signal is provided to the circuit block, trembles or glitches, however, may occur because of the limited driving capability of the reference voltage signal. The circuit block may need to wait a period of time before the reference voltage signal settles (i.e., becomes stable) so as to function correctly according to the settled reference voltage signal. The operation speed of the circuit block is therefore confined because of the settling time of the reference voltage signal. The sentence "reference voltage signal settles" mentioned above means the reference voltage signal is suitable for the circuit block to refer and function accordingly.

To reduce the influence of the glitches and trembles, the reference voltage signal is usually coupled with the voltage buffer before providing to the circuit block. The voltage buffer has higher driving capability to drive the circuit block and therefore provides a more stable reference voltage signal. For example, the voltage buffer may be realized with unity gain amplifiers.

In some circumstances, the voltage buffer still may not provide enough driving capability, e.g., when the impedance of the load increases or the time for driving the load decreases. Several improvements may be needed for providing a stable reference voltage signal to the load, e.g., increasing the bandwidth of the voltage buffer, lowering the output impedance of the voltage buffer, and dynamically varying the output current of the voltage buffer. Therefore, the hardware of the voltage buffer and the consumed power both increase quadratically and result in the waste of hardware cost and energy.

SUMMARY

In view of the foregoing, it can be appreciated that a substantial need exists for methods and apparatuses that can mitigate or reduce the problems above.

An example embodiment of a reference voltage stabilization apparatus is disclosed, comprising: an input node for receiving a reference voltage signal; an output node for coupling with a load; a voltage buffer coupled between the input node and the output node; a charge storage device coupled with the output node; and a charging/discharging circuit coupled with the charge storage device; wherein after the charging/discharging circuit charges and/or discharges the charge storage device, the voltage buffer and the charged/discharged charge storage device are coupled with the load so that the voltage at the load equals the reference voltage signal after a period of time.

An example embodiment of a reference voltage stabilization method is disclosed, comprising: receiving a reference voltage signal with a voltage buffer; charging and/or discharging a charge storage device; and coupling the voltage buffer and the charged/discharged charge storage device with a load so that the voltage at the load equals the reference voltage signal after a period of time.

Another example embodiment of an reference voltage stabilization apparatus is disclosed, comprising: a first input node, for receiving a first reference voltage signal; a second input node, for receiving a second reference voltage signal; a first output node and a second output node; a first voltage buffer coupled between the first input node and the first output node; a second voltage buffer coupled between the second input node and the second output node; a first charge storage device coupled with the first output node; a second charge storage device coupled with the second output node; a charging circuit coupled with the first charge storage device; and a discharging circuit coupled with the second charge storage device; wherein the charging circuit charges the first charge storage device and the discharging circuit discharges the second charge storage device; the first voltage buffer and the charged first charge storage device provide a first output voltage signal at the first output node, and the second voltage buffer and the discharged second charge storage device provide a second output voltage signal at the second output node so that the difference between the first output voltage signal and the second output voltage signal equals the difference between the first reference voltage signal and the second reference voltage signal after a period of time.

It is to be understood that both the foregoing general description and the following detailed description are examples and explanatory only and are not restrictive of the invention, as claimed.

DETAILED DESCRIPTION

Reference will now be made in detail to embodiments of the invention, which are illustrated in the accompanying drawings. The same reference numbers may be used throughout the drawings to refer to the same or like parts, components, and/or operations. Certain terms are used throughout the description and following claims to refer to particular components. As one skilled in the art will appreciate, a component may be referred by different names. This disclosure does not intend to distinguish between components that differ in name but not in function. In the following description and in the claims, the term "comprise" is used in an open-ended fashion, and thus should be interpreted to mean "include, but not limited to." The phrase "couple with" is intended to compass any indirect or direct connection. Accordingly, when "a first device is coupled with a second device" is mentioned in this disclosure, it means that the first device may be directly or indirectly connected to the second device through electrical connections, wireless communications, optical communications, or other signal connections with/without other intermediate devices or connection means.

Figure 1:
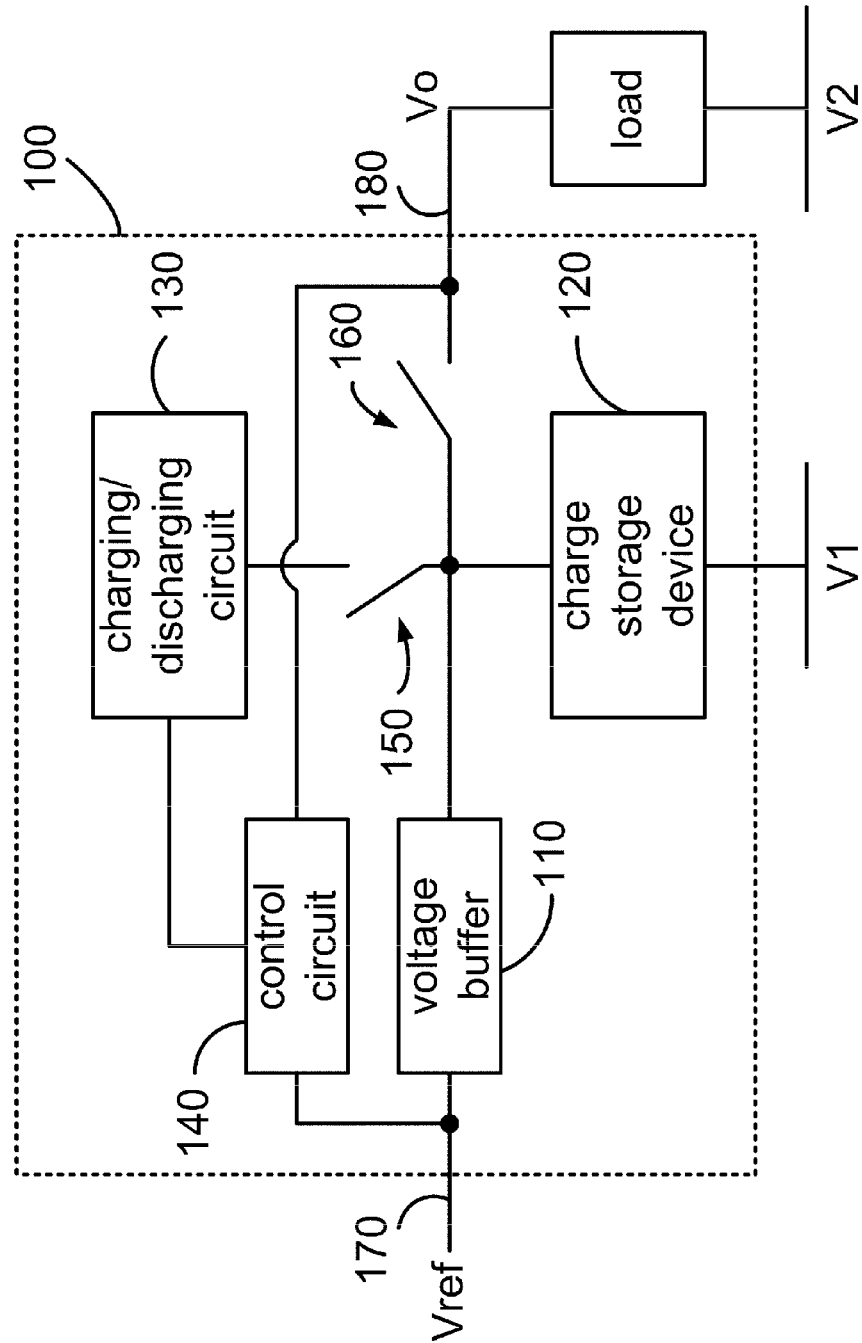
FIG. 1 shows a simplified functional block diagram of an example reference voltage stabilization apparatus.

FIG. 1 shows a simplified block diagram of an example reference voltage stabilization apparatus 100, arranged in accordance with at least some embodiments of the present disclosure. The reference voltage stabilization apparatus 100 comprises a voltage buffer 110, a charge storage device 120, a charging/discharging circuit 130, a control circuit 140, switches 150 and 160, an input node 170, and an output node 180. The reference voltage stabilization apparatus 100 may receive a reference voltage signal Vref and provide to a load an output voltage signal Vo, which is substantially the same as the reference voltage signal Vref. The load may comprise any suitable active elements and/or passive elements, and is coupled between the output node 180 of the reference voltage stabilization apparatus 100 and a voltage level V2.

The voltage buffer 110 may be realized with a negative feedback amplifier, an amplifier circuit with a source follower, a common source amplifier, a class AB amplifier, etc. In other embodiments, the voltage buffer 110 may also be realized with other types of electrical circuits to receive the reference voltage signal Vref from the input node 170 and to provide the output voltage signal Vo substantially the same as the reference voltage signal Vref.

The charge storage device 120 is coupled between the charging/discharging circuit 130 and a voltage level V1 for storing electrical charges. The charge storage device 120 may be realized with a capacitor, a plurality of capacitors, the combination of capacitors and other circuit elements, etc.

The charging/discharging circuit 130 is used to charge and/or discharge the charge storage device 120 so that the charge storage device 120 may store a predetermined amount of charges. For example, the charging/discharging circuit 130 may be realized with any suitable types of current source circuits.

The control circuit 140 is used to configure the charging/discharging circuit 130 to charge and/or discharge the charge storage device 120 to the suitable amount of charges. For example, the control circuit 140 may configure the charging/discharging circuit 130 by using a lookup table with the value of the reference voltage signal Vref and/or the value of the output voltage signal Vo. The control circuit 140 may also be realized with any suitable types of analog and/or digital signal processing circuit so as to configure the charging/discharging circuit 130 to charge/discharge the charge storage device 120 to the suitable amount of charges. Furthermore, the control circuit 140 may configure the conduction of the switches 150 and 160 so as to provide the output voltage signal Vo at the output node 180 at suitable time.

Figure 2:
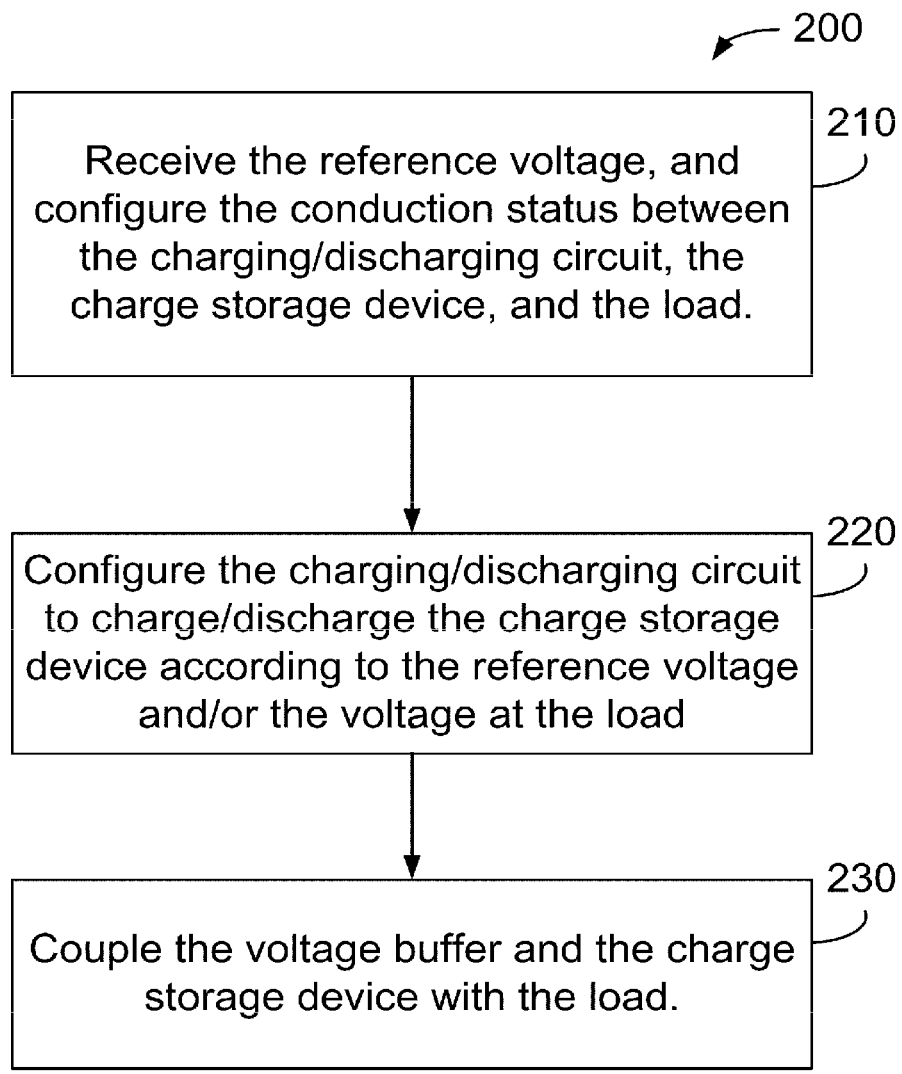
FIG. 2 shows a simplified flowchart of an example reference voltage stabilization method.

FIG. 2 shows a simplified flowchart 200 of an example reference voltage stabilization method of the reference voltage stabilization apparatus 100, arranged in accordance with at least some embodiments of the present disclosure. The operation of the reference voltage stabilization apparatus 100 is further explained below with FIGS. 1 and 2.

In the operation 210, the reference voltage stabilization apparatus 100 receives the reference voltage signal Vref. The control circuit 140 configures the switch 150 to be conducting and configures the switch 160 to be nonconducting. Therefore, the charging/discharging circuit 130 is coupled with the charge storage device 120, and the voltage buffer 110 and the charge storage device 120 is disconnected from the load.

In the operation 220, the control circuit 140 configures the charging/discharging circuit 130 to charge/discharge the charge storage device 120 to the suitable amount of charge according to the reference voltage signal Vref and/or the output voltage signal Vo.

In the operation 230, the control circuit 140 configures the switches 150 to be nonconducting and configures the switch 160 to be conducting. Thus, the voltage buffer 110 and the charge storage device 120 are coupled with the load, and the output voltage signal Vo at the output node 180 may be substantially equal to the reference voltage signal Vref very rapidly.

In the embodiments above, the control circuit 140 may adopt any suitable algorithms to configure the charging operation or discharging operation of the charging/discharging circuit 130. For example, in some embodiments, the control circuit 140 may configure the charging/discharging time, the charging/discharging current, and/or the charging/discharging voltage of the charging/discharging circuit 130 to the charge storage device 120. In another embodiment, the charge storage device 120 comprises a plurality of capacitors. The control circuit 140 may configures the charging/discharging circuit 130 to charge/discharge one or more capacitors for storing the suitable amount of charges in the charge storage device 120.

In the embodiments above, the control circuit 140 may determine the amount of charges to be stored in the charge storage device 120 according to the reference voltage signal Vref and the output voltage signal Vo. For example, in one embodiment, the capacitance of the load is represented by C1 and the capacitance of the charge storage device 120 is represented by C2. If the load receives the amount of charges Q1, the voltage of the load becomes the reference voltage signal Vref. The control circuit 140 may configure the charging/discharging circuit 130 to charge the charge storage device 120 with the amount of charges Q1+Q2, wherein Q2 is amount of charges for the voltage of the charge storage device 130 to become the reference voltage signal Vref. When the voltage buffer 110 and the charge storage device 120 are coupled with the load, the amount of charges Q1 flows from the charge storage device 120 to the load. Therefore, the voltage of the voltage buffer 110, the voltage of the charge storage device 120, and the voltage of the load become substantially the same as the reference voltage signal Vref. Because the charges transmit between the charge storage device 120 and the load very rapidly, the time for the output voltage signal Vo at the output node 180 to become the reference voltage signal Vref is not dominated by the current of the voltage buffer 110. The hardware requirement for the voltage buffer 110 therefore may be reduced. Moreover, the control circuit 140 may configure the suitable amount of charges stored in the charge storage device 120 so that the glitches may be reduced when the reference voltage apparatus 100 is coupled with the load.

In another embodiment of the operation 220, the control circuit 140 may configure the charging/discharging circuit 130 without referring to the reference voltage signal Vref or the output voltage signal Vo. For example, the control circuit 140 may configure the charging/discharging circuit 130 to charge/discharge the charge storage device 120 in one or more predetermined interval(s) of time, or with one or more predetermined amount of charges.

In another embodiment of the operation 220, the control circuit 140 may configure the charging/discharging circuit 130 according to one of the reference voltage signal Vref and the output voltage signal Vo. For example, the control circuit 140 may detect the value of the glitch(es) and accordingly configure the amount of charges, which the charging/discharging circuit 130 charges/discharges the charge storage device 120.

In some embodiments, the control circuit 140 may combine multiple algorithms for configuring the charging/discharging circuit 130. In other embodiments, the control circuit 140 may be simplified or omitted.

In the embodiments above, a switch (not shown in FIG. 1) may be configured between the voltage buffer 110 and the charge storage device 120. When the charging/discharging circuit 130 charges/discharges the charge storage device 120, the switch does not conduct the voltage buffer 110 and the charge storage device 120. When the charge storage device 120 already stores the suitable amount of charges, the control circuit 140 configures the switch to conduct the voltage buffer 110 and the charge storage device 120.

In the embodiments of the operation 230 above, when the voltage buffer 110 and the charge storage device 120 are coupled with the load, the charging/discharging circuit 130 may also be coupled with the load for a suitable period of time for charging/discharging the load. Therefore, the output voltage signal Vo at the output node 180 may be substantially equal to the reference voltage signal Vref more rapidly.

In the embodiments of the operation 230 above, the voltage buffer 110 and the charge storage device 120 may be coupled with the load at the same time or at different points of time.

In the embodiments above, the control circuit 140 may determine the amount of charges stored in the charge storage device 120 according to the charging/discharging time of the charging/discharging circuit 130, the charging/discharging voltage of the charging/discharging circuit 130, the charging/discharging current of the charging/discharging circuit 130, the voltage of the charge storage device 120, and/or the impedance of the charge storage device 120.

In the embodiments above, the voltage level V1 and the voltage level V2 in FIG. 1 may be the same voltage level or different voltage levels.

In the embodiments above, the charging/discharging circuit 130 may only perform the charging operation or only perform the discharging operation. The charging/discharging circuit 130 may also perform both the charging operation and the discharging operation.

In the embodiments above, the charging/discharging circuit 130 may charge the charge storage device 120 with a voltage level higher than the reference voltage signal Vref so that the voltage of the charged charge storage device 120 is greater than or equal to the reference voltage signal Vref. The charging/discharging circuit 130 may discharge the charge storage device 120 with a voltage level lower than the reference voltage signal Vref so that the voltage of the charged charge storage device 120 is less than or equal to the reference voltage signal Vref.

Figure 3:
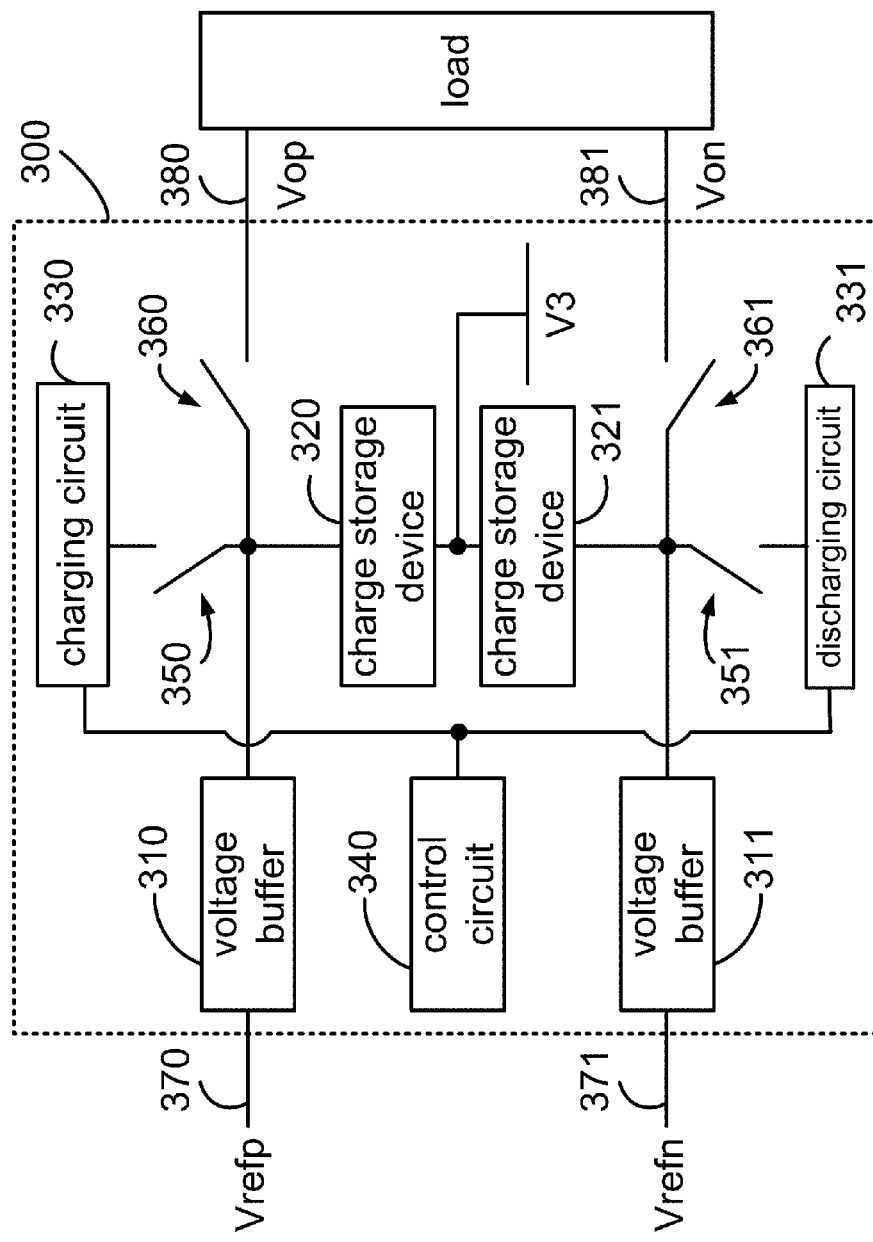
FIG. 3 shows a simplified functional block diagram of another example reference voltage stabilization apparatus, all arranged in accordance with at least some embodiments of the present disclosure described herein.

FIG. 3 shows a simplified block diagram of another example reference voltage stabilization apparatus 300, arranged in accordance with at least some embodiments of the present disclosure. The reference voltage stabilization apparatus 300 comprises voltage buffers 310 and 311, charge storage devices 320 and 321, a charging circuit 330, a discharging circuit 331, a control circuit 340, switches 350, 351, 360, and 361, input nodes 370 and 371, and output nodes 380 and 381. The reference voltage stabilization apparatus 300 may receive differential reference voltage signals Vrefp and Vrefn from the input nodes 370 and 371, and provide differential output voltage signals Vop and Von at the output nodes 380 and 381 to the load. The load may therefore receive the differential output voltage signals Vop and Von, which are substantially the same as the differential output voltage signals Vrefp and Vrefn.

The voltage buffers 310 and 311, the charge storage devices 320 and 321, the charging circuit 330, the discharging circuit 331, the control circuit 340, and the switches 350, 351, 360, and 361 are coupled and operate similar to the counterparts in FIG. 1. The operation and variation of the elements may be referred to the corresponding description above.

In the embodiment of FIG. 3, the reference voltage stabilization apparatus 300 need to provide differential output voltage signals Vop and Von. The control circuit 340 configures the charging circuit 330 to charge the charge storage device 320 to the suitable amount of charges and configures the discharging circuit 331 to discharge the charge storage device 321 to the suitable amount of charges. When the control circuit 340 configures the switches 350 and 351 to be nonconducting and configures the switches 360 and 361 to be conducting, the voltage buffers 310 and 311 and the charge storage devices 320 and 321 are coupled with the load so that the differential voltage signals Vop and Von, which the load receive at the output nodes 380 and 381, may be substantially equal to the differential reference voltage signals Vrefp and Vrefn rapidly.

In this embodiment, the charge storage devices 320 and 321 are coupled with a voltage level V3. In other embodiments, the charge storage devices 320 and 321 may be coupled with different voltage levels, respectively.

In this embodiment, the output voltage signals Vop and Von are substantially the same as the reference voltage signals Vrefp and Vrefn, respectively. In other embodiments, the output voltage signals Vop and Von may not be substantially the same as the reference voltage signals Vrefp and Vrefn, respectively, but the difference between the output voltage signals Vop and Von is substantially the same as the difference of the reference voltage signals Vrefp and Vrefn.

In the embodiments above, additional switches (not shown in FIG. 3) may be configured between the voltage buffer 310 and the charge storage device 320, and between the voltage buffer 311 and the charge storage device 321. When the charging circuit 330 charges the charge storage device 320 and/or the discharging circuit 331 discharges the charge storage device 321, the switch does not conduct the voltage buffer 310 and the charge storage device 320 and/or the switch does not conduct the voltage buffer 311 and the charge storage device 321. When the charge storage device 320 already stores the suitable amount of charges, the switch conducts the voltage buffer 310 and the charge storage device 320 and/or the switch conducts voltage buffer 311 and the charge storage device 321.

In the embodiments of the reference voltage stabilization apparatuses above, the charging/discharging circuit charges and/or discharges the charge storage device(s) to the suitable amount of charges in advance. When the voltage buffer(s) and the charge storage device(s) are coupled with the load, the charges may be rapidly transmitted to the load or receive form the load. The load may therefore receive an output voltage signal, which is substantially equal to the reference voltage signal, in a short period of time. The voltage buffer only needs to compensate the voltage difference so that the output voltage signal of the reference voltage stabilization apparatus may be substantially equal to the reference voltage signal rapidly. The bandwidth and driving requirements of the voltage buffer may be lowered. Besides, the charge storage device (e.g., capacitor) requires small hardware area and consumes little energy. Thus, the complexity, the hardware cost, and the consumed energy of the reference voltage stabilization apparatus may be efficiently reduced.

Because the charges may be rapidly transmitted between the charge storage device and the load and the voltage buffer only need to compensate the voltage difference, the reference voltage stabilization apparatus is suitable for high-speed applications, e.g., high-speed analog-to-digital converters (ADC).

In the applications of the successive approximation ADC (SAR ADC), the control circuit may configure the charging/discharging circuit to charge and/or discharge the charge storage device to the precise amount of charges by using a lookup table or other algorithms.

The embodiments above may also be combined with other improvements of the voltage buffer, e.g., enhancing the bandwidth of the voltage buffer, lowering the output impedance of the voltage buffer, and/or dynamically varying the output current of the voltage buffer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A reference voltage stabilization apparatus, comprising:
   an input node for receiving a reference voltage signal;
   an output node for coupling with a load;
   a voltage buffer coupled between the input node and the output node;
   a charge storage device coupled with the output node;
   a control circuit; and
   a charging/discharging circuit coupled with the charge storage device;
   wherein after the charging/discharging circuit charges and/or discharges the charge storage device, the voltage buffer and the charge storage device are coupled with the load so that a voltage at the load equals the reference voltage signal after a period of time;
   wherein the control circuit disconnects the charge storage device from the load, and configures the charging/discharging circuit to charge and/or discharge the charge storage device in a first period; and the control circuit disconnects the charging/discharging circuit from the charge storage device, and configures the charge storage device to couple with the load for transmitting charges to the load or receiving charges from the load in a second period.

2. The reference voltage stabilization apparatus of claim 1, wherein the control circuit configures a charging/discharging time, a charging/discharging current, and/or a charging/discharging voltage of the charging/discharging circuit according to the reference voltage signal and/or the voltage at the load.

3. The reference voltage stabilization apparatus of claim 1, wherein the control circuit configures the charging/discharging circuit to charge and/or discharge one or more capacitors in the charge storage device according to the reference voltage signal and/or the voltage at the load.

4. The reference voltage stabilization apparatus of claim 1, wherein the control circuit further comprises a signal processing circuit and/or a lookup table for configuring the charging/discharging circuit to charge and/or discharge the charge storage device.

5. The reference voltage stabilization apparatus of claim 1, wherein the voltage of the charge storage device is greater than or equal to the reference voltage signal after being charged by the charging/discharging circuit, and/or the voltage of the charge storage device is less than or equal to the reference voltage signal after being discharged by the charging/discharging circuit.

6. The reference voltage stabilization apparatus of claim 1, wherein the control circuit disconnects the voltage buffer from the charge storage device in the first period, and configures the voltage buffer to couple with the load in the second period.

7. A reference voltage stabilization method, comprising:
   receiving a reference voltage signal with a voltage buffer;
   charging and/or discharging a charge storage device;
   coupling the voltage buffer and the charge storage device with a load so that a voltage at the load equals the reference voltage signal after a period of time;
   disconnecting the charge storage device from the load, and configuring the charging/discharging circuit to charge and/or discharge the charge storage device in a first period; and
   disconnecting the charging/discharging circuit from the charge storage device, and configuring the charge storage device to couple with the load for transmitting charges to the load or receiving charges from the load in a second period.

8. The reference voltage stabilization method of claim 7, further comprising:
   configuring a charging/discharging time, a charging/discharging current, and/or a charging/discharging voltage of the charging/discharging circuit according to the reference voltage signal and/or the voltage at the load.

9. The reference voltage stabilization method of claim 7, further comprising:
   configuring the charging/discharging circuit to charge and/or discharge one or more capacitors in the charge storage device according to the reference voltage signal and/or the voltage at the load.

10. The reference voltage stabilization method of claim 7, wherein a voltage of the charge storage device is greater than or equal to the reference voltage signal after being charged by the charging/discharging circuit, and/or the voltage of the charge storage device is less than or equal to the reference voltage signal after being discharged by the charging/discharging circuit.

11. The reference voltage stabilization method of claim 7, further comprising:
    disconnecting the voltage buffer from the charge storage device in the first period, and configuring the voltage buffer to couple with the load in the second period.

12. A reference voltage stabilization apparatus, comprising:
    a first input node, for receiving a first reference voltage signal;
    a second input node, for receiving a second reference voltage signal;
    a first output node and a second output node;
    a first voltage buffer coupled between the first input node and the first output node;
    a second voltage buffer coupled between the second input node and the second output node;
    a first charge storage device coupled with the first output node;
    a second charge storage device coupled with the second output node;
    a charging circuit coupled with the first charge storage device; and
    a discharging circuit coupled with the second charge storage device;
    wherein the charging circuit charges the first charge storage device and the discharging circuit discharges the second charge storage device; the first voltage buffer and the charged first charge storage device provide a first output voltage signal at the first output node, and the second voltage buffer and the discharged second charge storage device provide a second output voltage signal at the second output node so that a difference between the first output voltage signal and the second output voltage signal equals a difference between the first reference voltage signal and the second reference voltage signal after a period of time.

13. The reference voltage stabilization apparatus of claim 12, further comprising a control circuit; wherein the control circuit disconnects the first charge storage device from the first output node, and configures the charging circuit to charge the first charge storage device in a first period; and the control circuit disconnects the charging circuit from the first charge storage device, and configures the first charge storage device to couple with the first output node for transmitting charges to the first output node in a second period.

14. The reference voltage stabilization apparatus of claim 13, wherein the control circuit disconnects the second charge storage device from the second output node, and configures the discharging circuit to discharge the second charge storage device in the first period; and the control circuit disconnects the discharging circuit from the second charge storage device, and configures the second charge storage device to couple with the second output node for receiving charges from the second output node in the second period.

15. The reference voltage stabilization apparatus of claim 13, wherein the control circuit configures a charging/discharging time, a charging/discharging current, and/or a charging/discharging voltage of the charging circuit and/or the discharging circuit according to the first reference voltage signal, the second reference voltage signal, the first output voltage signal, and/or the second output voltage signal.

16. The reference voltage stabilization apparatus of claim 13, wherein the control circuit configures the charging circuit to charge one or more capacitors in the first charge storage device according to the first reference voltage signal, the second reference voltage signal, the first output voltage signal, and/or the second output voltage signal.

17. The reference voltage stabilization apparatus of claim 13, wherein the control circuit further comprises a signal processing circuit and/or a lookup table for configuring the charging/discharging circuit to charge and/or discharge the charge storage device.

18. The reference voltage stabilization apparatus of claim 13, wherein the voltage of the first charge storage device is greater than or equal to the first reference voltage signal after being charged by the charging circuit, and the voltage of the second charge storage device is less than or equal to the second reference voltage signal after being discharged by the discharging circuit.

* * * * *